US006347055B1

(12) United States Patent
Motomura

(10) Patent No.: US 6,347,055 B1
(45) Date of Patent: Feb. 12, 2002

(54) LINE BUFFER TYPE SEMICONDUCTOR MEMORY DEVICE CAPABLE OF DIRECT PREFETCH AND RESTORE OPERATIONS

(75) Inventor: Masato Motomura, Tokyo (JP)

(73) Assignee: NEC Corporation, Tokyo (JP)

(*) Notice: Subject to any disclaimer, the term of this patent is extended or adjusted under 35 U.S.C. 154(b) by 37 days.

(21) Appl. No.: 09/599,930

(22) Filed: Jun. 22, 2000

(30) Foreign Application Priority Data

Jun. 24, 1999 (JP) .......................................... 11-178886

(51) Int. Cl.[7] .............................................. G11C 16/04
(52) U.S. Cl. ............................ 365/189.05; 365/189.01; 365/230.08
(58) Field of Search ....................... 365/189.05, 189.01, 365/189.04, 189.08, 230.08

(56) References Cited

U.S. PATENT DOCUMENTS 5,469,381 A * 11/1995 Yamazaki .............. 365/189.01

FOREIGN PATENT DOCUMENTS

JP         10-326225         12/1998

OTHER PUBLICATIONS

NEC Corporation, "64M–BIT Virtual Channel SDRAM with Double Data Rate", Preliminary Data Sheet, 1998, pp. 1–111.

* cited by examiner

Primary Examiner—David Nelms
Assistant Examiner—David Lam

(57) ABSTRACT

In a line buffer type semiconductor memory device contructed by a memory section and a line buffer section including a plurality of line buffers each capable of storing data of one segment size, a direct fetch control section reads first data of one segment size from the memory section and writes the first data into one of the line buffers, and a direct restore control section reads second data of one segment size from one of the line buffers and writes the second data into the memory section.

7 Claims, 10 Drawing Sheets

BACKGROUND OPERATION
(DIRECT PREFETCH OPERATION)

BACKGROUND OPERATION
(DIRECT PREFETCH OPERATION)

LINE BUFFER TYPE SEMICONDUCTOR MEMORY DEVICE CAPABLE OF DIRECT PREFETCH AND RESTORE OPERATIONS

BACKGROUND OF THE INVENTION

1. Field of the Invention

The present invention relates to a line buffer type semiconductor memory device.

2. Description of the Related Art

Recently, in order to enhance the access speed, line buffers for temporarily storing data are introduced into a conventional semiconductor memory device. This line buffer type semiconductor memory device is also called a virtual channel memory where line buffers correspond to channels (see : NEC Corporation, "64M-bit Virtual Channel SDRAM with Double Data Rate", Preliminary Data Sheet, 1998).

In a prior art line buffer type semiconductor memory device (see the above-mentioned document), a background operation is carried out between a memory section and a line buffer section, and a foreground operation is carried out between the line buffer section and the data buffer. The background operation is constructed by a page open operation, a prefetch operation, a restore operation and a page close operation.

On the other hand, the foreground operation is constructed by a line buffer read operation and a line buffer write operation. This will be explained later in detail.

If the line buffer type semiconductor memory device is accessed by a plurality of memory masters, since the memory addresses of the memory masters have no relationship to each other, or the memory masters have independent localization of memory addresses, page open operations often occur in the line buffer type semiconductor memory device, which may delay the memory access. This is called a memory access mutual interference or a memory access mutual contamination.

In order to avoid the memory access mutual interference, a memory controller is provided to allocate the line buffers of the line buffer section to the memory masters in advance, so that the localization's of memory addresses of the memory masters does not overlap.

In the above-described line buffer type semiconductor memory device, however, since there are four kinds of memory access modes, i.e., a page hit mode, a page mishit mode, a line buffer hit mode a line buffer mishit mode, which have different access times, the management for scheduling the memory access is complex.

Also, even in a page mishit mode or a line buffer mishit mode, at least one page open operation and at least one prefetch operation are carried out to access the line buffer section, which delays the memory access. Additionally, in a line buffer mishit mode, the memory management of what page is opened and the line buffer management of which segments are located in the line buffers are required, which complicates the management of the device.

Particularly, in a prefetch operation where no pages are hot and no line buffers are hit, when one segment is required to be restored and the page including this segment is closed, a long complex sequence is required before the prefetch operation.

Further, when random memory accesses inviting line buffer mishit modes are carried out, background operations are often carried out, which also delays the memory access.

SUMMARY OF THE INVENTION

It is an object of the present invention to provide a line buffer type semiconductor memory device capable of simplifying the background operation and reducing the delay of the memory access.

According to the present invention, in a line buffer type semiconductor memory device constructed by a memory section and a line buffer section including a plurality of line buffers each capable of storing data of one segment size, a direct fetch control section reads first data of one segment size from the memory section and writes the first data into one of the line buffers, and a direct restore control section reads second data of one segment size from one of the line buffers and writes the second data into the memory section.

BRIEF DESCRIPTION OF THE DRAWINGS

The present invention will be more clearly understood from the description set forth below, as compared with the prior art, with reference to the accompanying drawings, wherein.

DESCRIPTION OF THE PREFERRED EMBODIMENT

Before the description of the preferred embodiment, a prior art line buffer type semiconductor memory device will be explained with reference to FIGS. 1 and 2 (see: the above-mentioned document).

Figure 1:
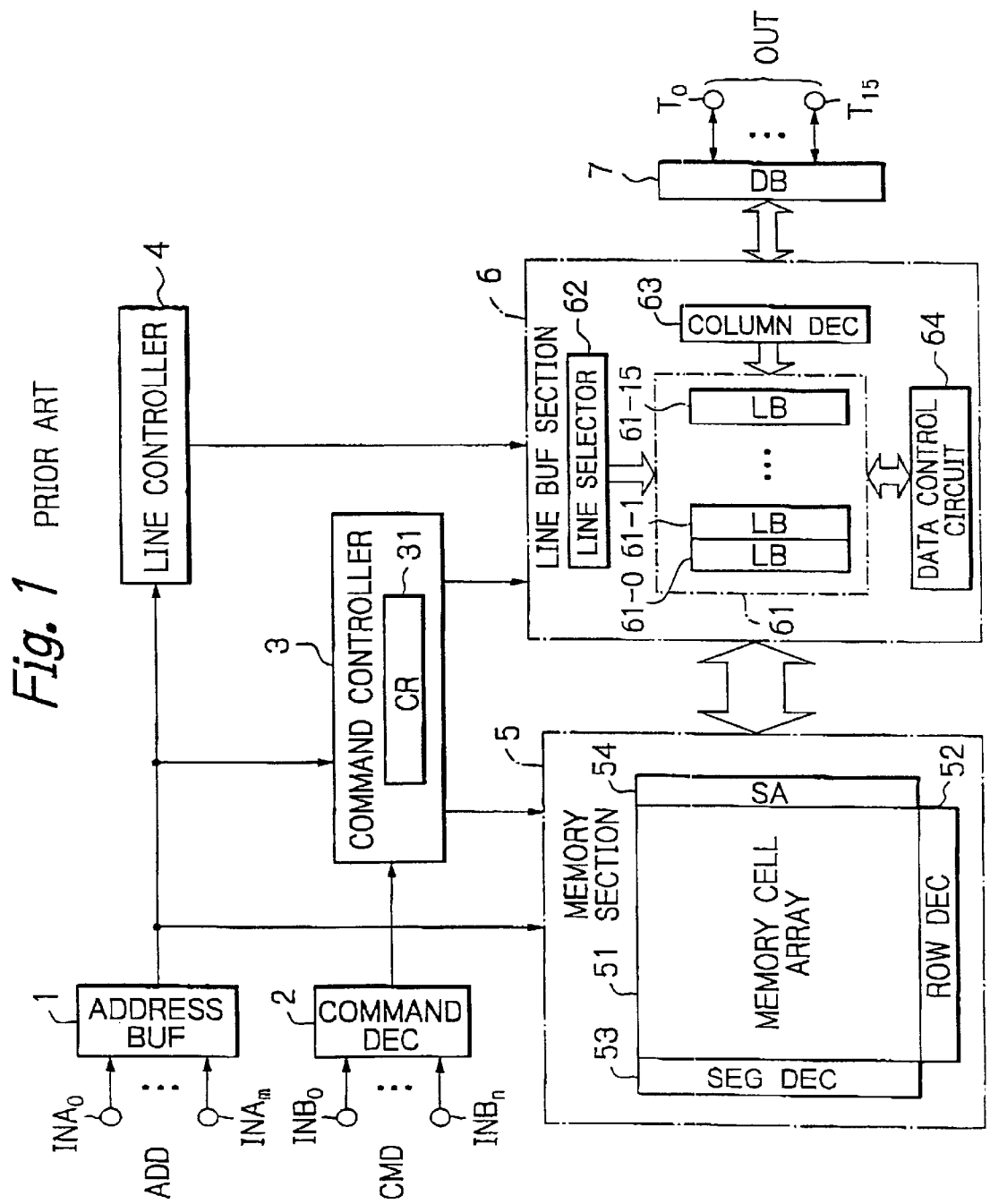
FIG. 1 is a block circuit diagram illustrating a prior art line buffer type semiconductor memory device.
Figure 2:
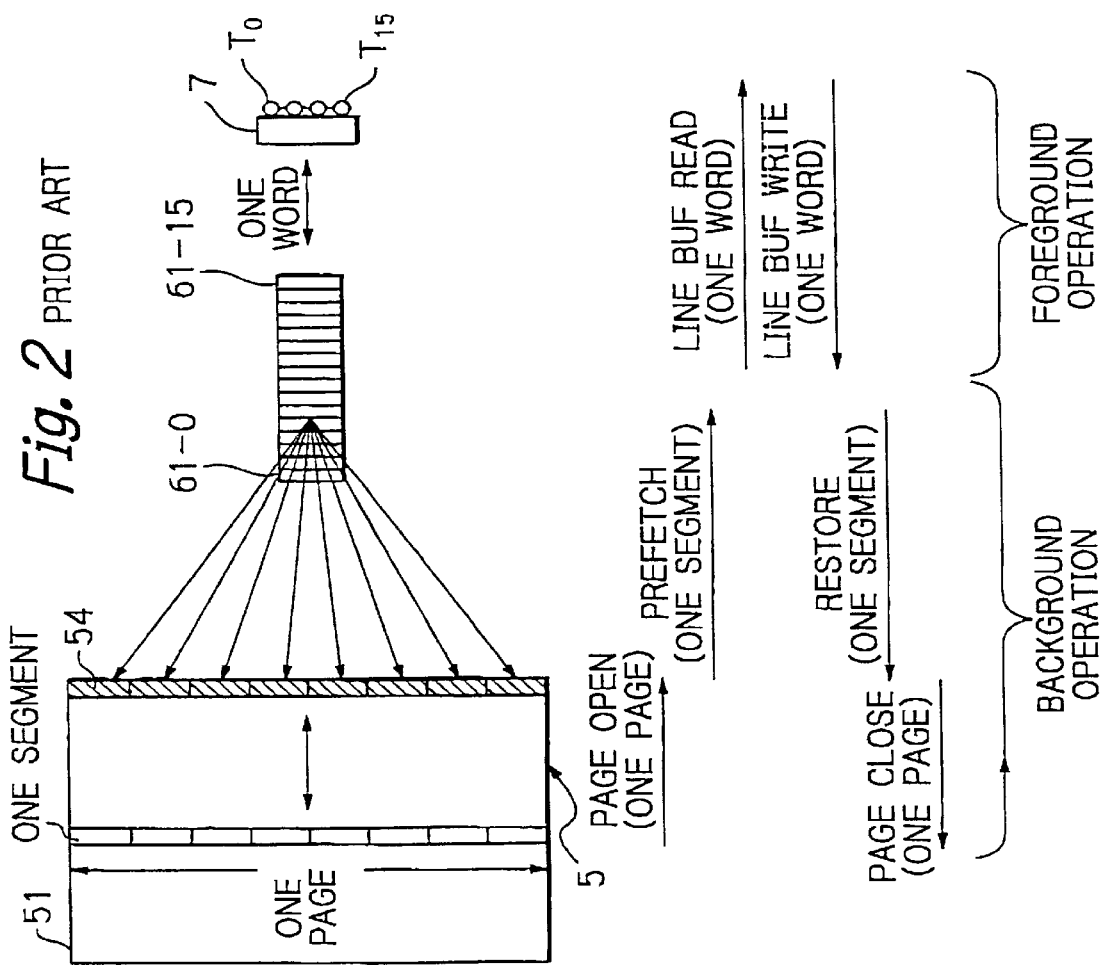
FIG. 2 is a diagram for explaining the operation of the device of FIG. 1.

In FIG. 1, which illustrates a prior art line buffer type semiconductor memory device, reference numeral 1 designates an address buffer for receiving an address signal ADD at address input terminals $INA_0$ to $INA_R$, and 2 designates a command decoder for decoding a command signal CMD at command input terminals $INB_0, \ldots, INB_n$. Also, a command controller 3 including a control register 31 is connected to the address buffer 1 and the command decoder 2, and a line controller 4 is connected to the address buffer 1.

The command controller 3 controls a memory section 5 and a line buffer section 6, and the line controller 4 controls the line buffer section 6. Also, the memory section 5 receives the address signal ADD from the address buffer 1.

The memory section 5 is connected to the line buffer section 6 which is also connected to a data buffer 7 having data input/output terminals $T_0$ to $T_{15}$.

The memory section 5 is constructed by a memory cell array 51, a row decoder 52, a segment decoder 53 and sense amplifiers 54.

The line buffer section 6 is constructed by line buffers 61-0, 61-1, ..., 61-15, a line selector 62, a column decoder 63 and a data control circuit 64. In this case, the line buffers 61-0, 61-1, ..., 61-15 are of a full associate type where an arbitrary segment of the memory section 5 is output to an arbitrary one of the line buffers 61-0, 61-1, ..., 61-15 and vice versa.

The operation of the device of FIG. 1 is explained next with reference to FIG. 2.

A background operation is carried out between the memory section 5 and the line buffer section 6, and a foreground operation is carried out between the line buffer section 6 and the data buffer 7.

The background operation is constructed by a page open operation, a prefetch operation, a restore operation and a page close operation. In more detail the page open operation selects and activates one page of 8 kbits in accordance with output signals of the row decoder 52 and the transmits data of this page to the sense amplifiers 54. The prefetch operation selects one segment of 1 kbits from the sense amplifiers 54 in accordance with output signals of the segment decoder 53 and transmits data of this segment to one of the line buffers 61-0, 61-1, ..., 61-15 selected by the line controller 4. The restore operation selects one of the line buffers 61-0, 61-1, ..., 61-15 in accordance with an output signal of the line controller 4 and transmits data of the selected line buffer to corresponding ones of the sense amplifiers, i.e., one segment of the memory cell array 51 indicated by the segment decoder 53. The page close operation closes the activated page to prepare for the next page open operation.

On the other hand, the foreground operation is constructed by a line buffer read operation and a line buffer write operation. In more detail, the line buffer read operation selects and reads one word of 16 bits from one of the line buffers 61-1, 61-2, ..., 61-5 selected by the line controller 4 in accordance with output signals of the column decoder 63, and transmits data of this word to the data buffer 7. The buffer write operation reads data of one word from the data buffer 7 and writes this data into a location of one of the line buffers 61-1, 61-2, ..., 61-15 selected by the line controller 4. Note that the location of this selected line buffer is indicated by the column decoder 63.

Figure 3:
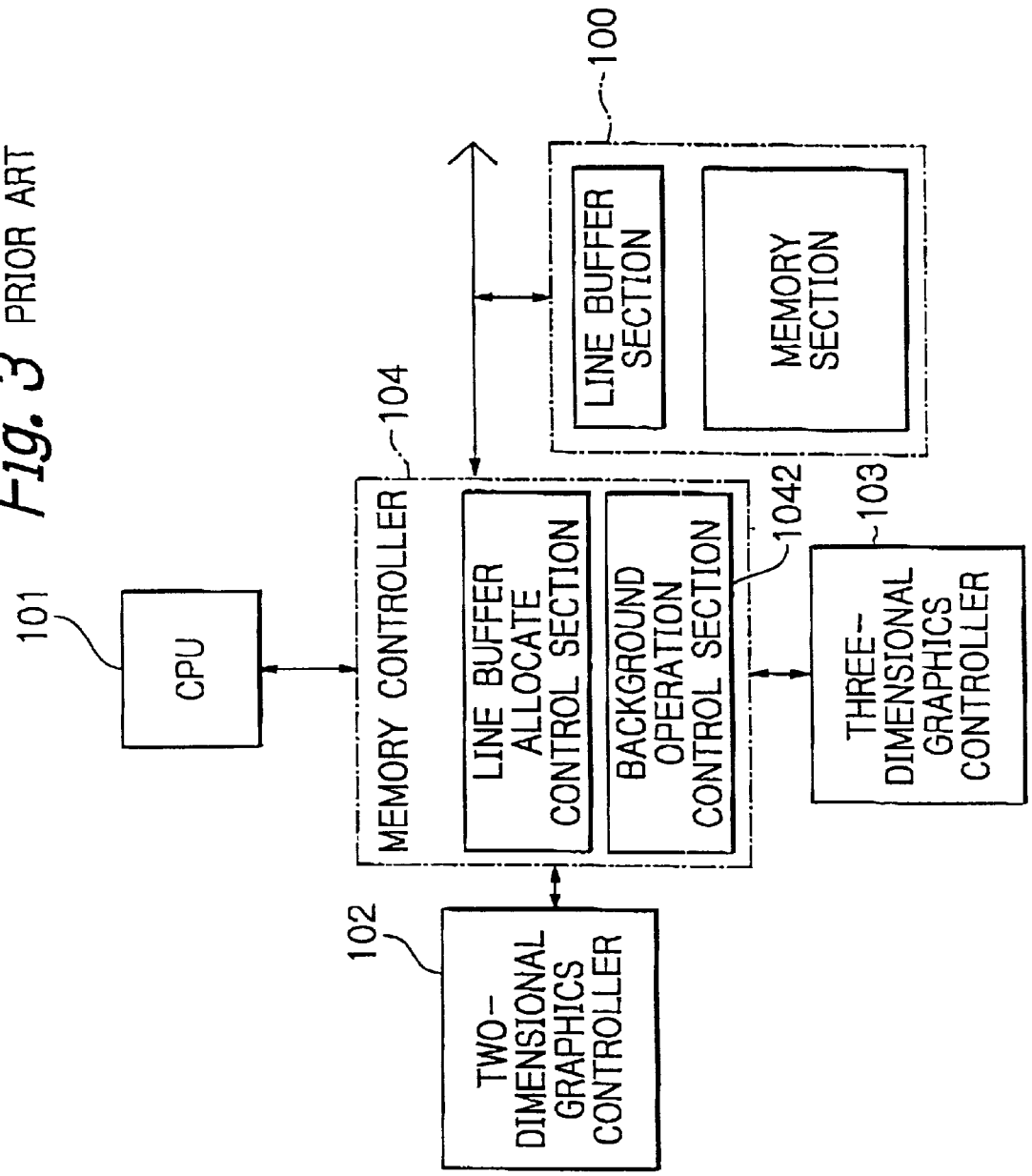
FIG. 3 is a block circuit diagram illustrating a computer system to which the device of FIG. 1 is applied.

In FIG. 3, which illustrates a computer system, reference numeral 100 designates the line buffer type semiconductor memory device of FIG. 1 which is accessed by a plurality of memory masters such as a central processing unit (CPU) 101, a two-dimensional graphics controller 102 and a three-dimensional graphics controller 103.

In FIG. 3, since the memory addresses of the memory masters 101, 102 and 103 have no relationship to each other, or the memory masters 101, 102 and 104 have independent localization of memory addresses, page open operations often occur in the line buffer type semiconductor memory device 100, which may delay the memory access. This is called a memory access mutual interference or a memory access mutual contamination.

Figure 4:
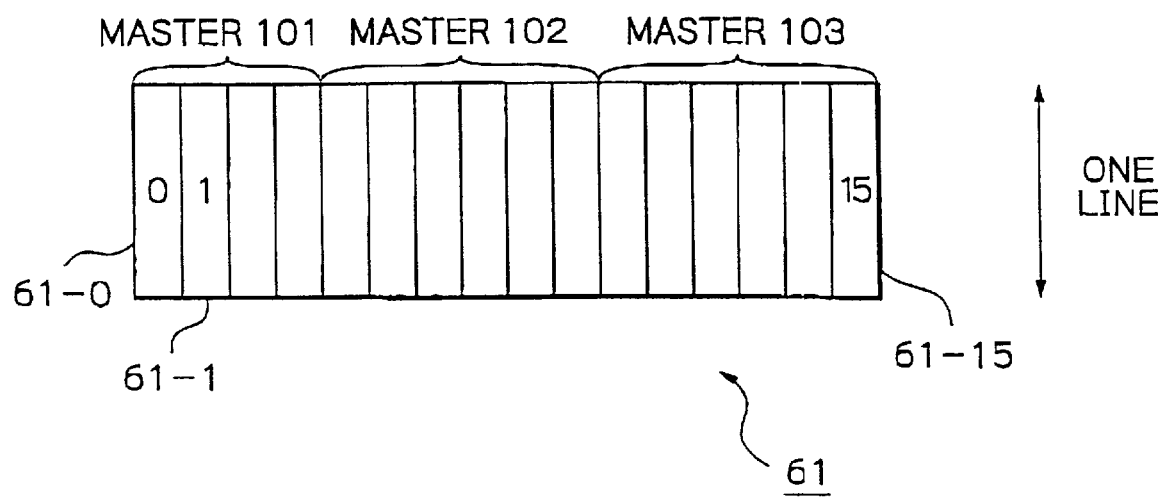
FIG. 4 is a block circuit diagram of the line buffer section of FIG. 1 for explaining the allocation of line buffers to the memory masters of FIG. 3.

In FIG. 3, in order to avoid the memory access mutual interference, a memory controller 104 is provided to allocate the line buffers of the line buffer section 61 to the memory masters 101, 102 and 103 as illustrated in FIG. 4, so that the localization's of memory addresses of the memory masters 101, 102 and 103 does not overlap.

The memory controller 104 is constructed by a line buffer allocation control section 1041 and a background operation control section 1042.

The line buffer allocation control section 1041 determines what line buffers are allocated to the memory masters 101, 102 and 103 in advance.

The background operation control section 1042 controls background operations so that a memory access can be substantially carried out by only foreground operations, thus reducing the access delay. In this case, the background operations are controlled to prefetch necessary data from the memory section 5 to the line buffer section 61 as soon as possible and restore unnecessary data from the line buffer section 61 to the memory section 5.

Note that the detailed operation of the memory controller 104 is not discussed in the above-mentioned prior art document.

In FIG. 3, however, since there are four kinds of memory access modes, i.e., a page hit mode, a page mishit mode, a line buffer hit mode a line buffer mishit mode, which have different access times, the management for scheduling the memory access is complex.

Also, even in a page mishit mode or a line buffer mishit mode, at least one page open operation and at least one prefetch operation are carried out to access the line buffer section 61, which delays the memory access. Additionally, in a line buffer mishit mode, the memory management of what page is opened and the line buffer management of which segments are located in the line buffers 61-0, 61-1, ..., 61-15 are required which complicates the management of the device.

Particularly, in a prefetch operation where no pages are hit and no line buffers are hit, when one segment is required to be restored and the page including this segment is closed, a complex long sequence formed by a page close operation, a page open operation, a restore operation, a page close operation and a page open operation is required before the prefetch operation. Note that such a prefetch operation may occur where all the line buffers 61-0, 61-1, ..., 61-15 are used so that there is no available line buffer for this prefetch operation.

Further, when random memory accesses inviting line buffer mishit modes are carried out, background operations are often carried out, which also delays the memory access.

Figure 5:
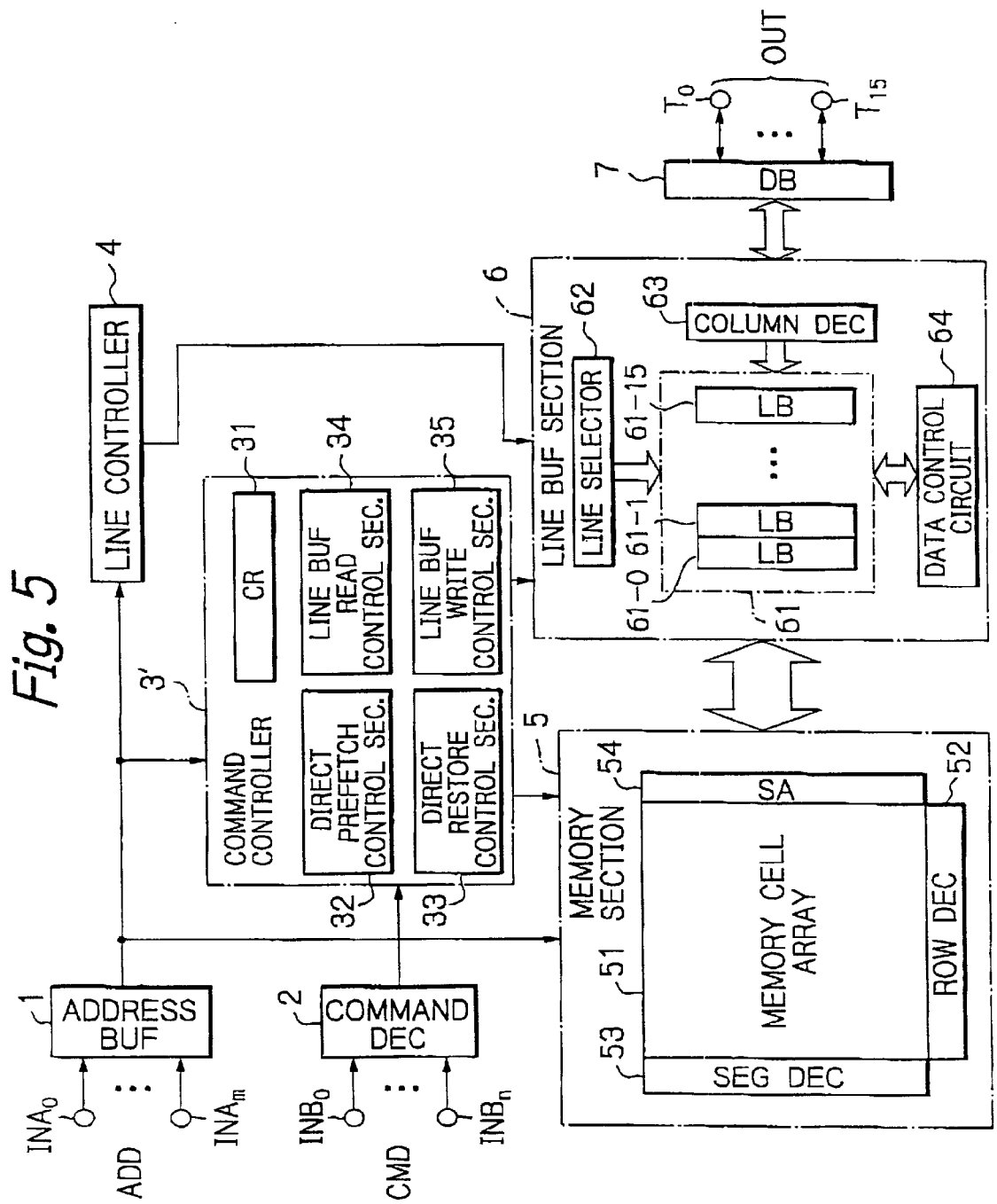
FIG. 5 is a block circuit diagram illustrating an embodiment of the line buffer type semiconductor memory device according to the present invention.

In FIG. 5, which illustrates an embodiment of the present invention, a command controller 3' is provided instead of the command controller 3 of FIG. 1. The command controller 3' is constructed by a control register 31, a direct prefetch control section 32, a direct restore control section 33, a line buffer read control section 34 and a line buffer section 35.

The direct prefetch control section 32 receives a direct prefetch command from the command decoder 2 to directly prefetch data of one segment from the memory section 51 to one of the line buffers 61-0, 61-1, ..., 61-15.

The direct restore control section 33 receives a directly restore data of one segment from one of the line buffers 61-0, 61-1, ..., 61-15 to the memory section 51.

The line buffer read control section 34 receives a line buffer read command from the command decoder 2 to read data of one word from one of the line buffers 61-0, 61-1, ..., 61-15 and transmit this word data to the data buffer 7.

The line buffer write control section 35 receives a line buffer write command from the command decoder 2 to write data of one word of the data buffer 7 into one of the line buffers 61-0, 61-1, ..., 61-15.

Figure 6:
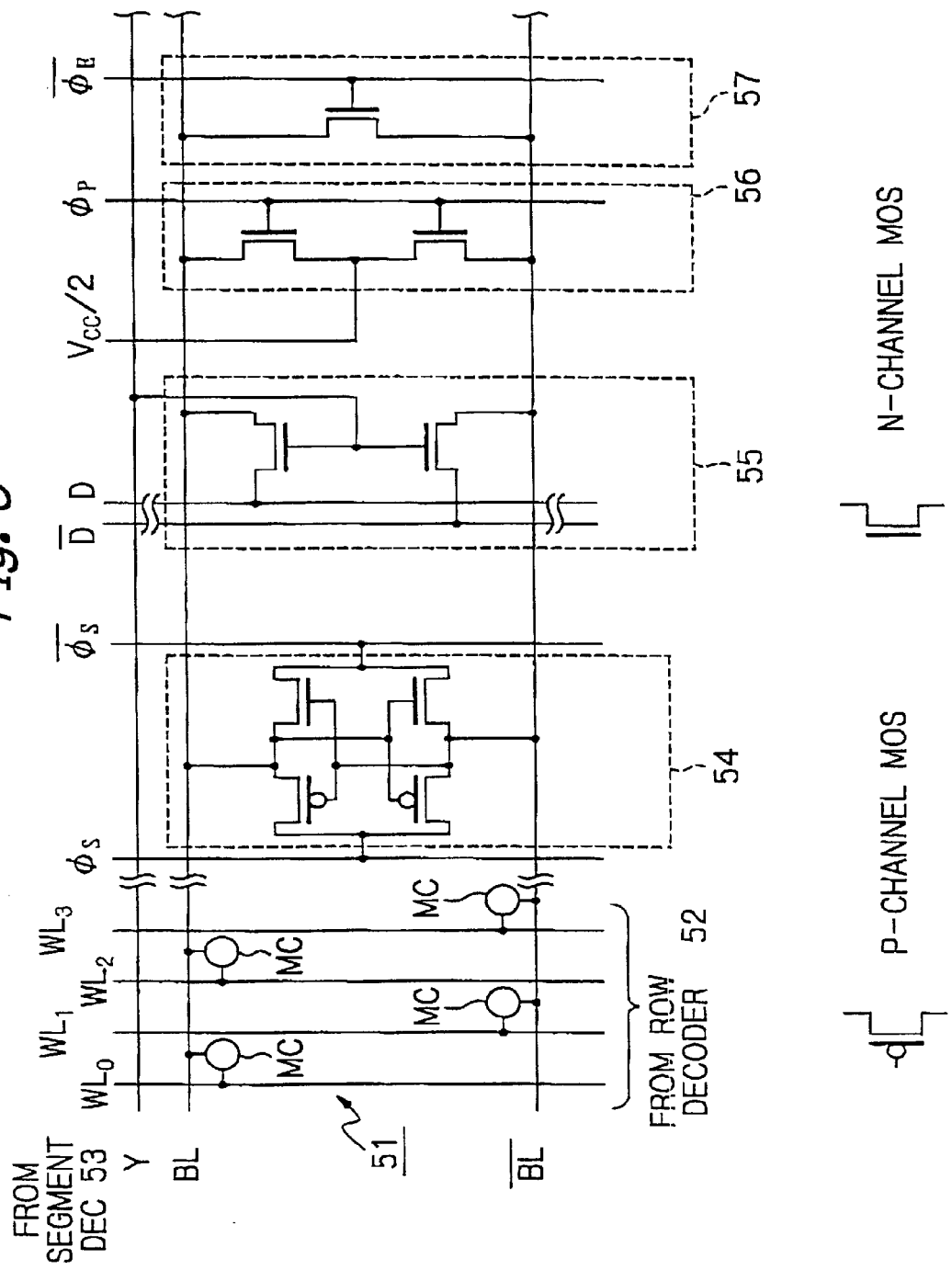
FIG. 6 is a detailed block circuit diagram of the memory section of FIG. 5.

The memory section 6 of FIG. 5 is explained next with reference to FIG. 6.

The memory cell array 51 is formed by memory cells M of a one-transistor, one-capacitor type located at intersections between word lines $WL_0$, $WL_1$, . . . and bit lines BL and $\overline{BL}$. The word lines $WL_0$, $WL_i$, . . . are selected by the row decoder 52. The bit lines BL and $\overline{BL}$ are connected to a sense amplifier of the sense amplifier section 54 which is activated by sense enable signals $\phi_S$ and $\overline{\phi}_S$ the bit lines BL and $\overline{BL}$ are also connected to a switch circuit 55 which connects the bit lines BL and $\overline{BL}$ to the data lines D and $\overline{D}$, respectively. The switch circuit 55 is turned ON and OFF by a voltage at a column selection line Y which is selected by the segment decoder 53. The bit lines BL and $\overline{BL}$ are further connected to a precharge circuit 56 and an equalizer 57 which are controlled by a precharge signal $\phi_P$ and an equalization signal $\phi_E$, respectively. In this case, the bit lines BL and $\overline{BL}$ are precharged by the precharge circuit 56 to $V_{CC}/2$ where $V_{CC}$ is a power supply voltage.

In a direct prefetch mode, data is read from the memory cell MC and sensed by the sense amplifier. Then, data on the bit lines BL and $\overline{BL}$ are output through the data switch circuit 55 to the data lines D and $\overline{D}$. Finally, the voltages at the bit lines BL and $\overline{BL}$ are precharged by the precharge circuit 56 and equalized by the equalizer 57. On the other hand, in a direct restore mode, data is written into the bit lines BL and $\overline{BL}$ through the switch circuit 55 and sensed by the sense amplifier. Then, data on the bit lines BL and $\overline{BL}$ are written into the memory cell MC. Finally, the voltages at the bit lines BL and $\overline{BL}$ are precharged by the precharge circuit 56 and equalized by the equalizer 57.

The operation of the device of FIG. 5 is explained next with reference to FIG. 7. Even in this case, a background operation is carried out between the memory section 5 and the line buffer section 6, and a foreground operation is carried out between the line buffer section 6 and the data buffer 7.

The background operation is constructed by a direct prefetch operation and a direct restore operation. In more detail the direct prefetch operation selects and activates one segment of 1 kbits from the memory cell array 51 in accordance with output signals of the segment decoder 53 and transmits data of this segment via the sense amplifier section 54 to one of the line buffers 61-0, 61-1, . . . , 61-15 selected by the line controller 4. The direct restore operation selects one of the line buffers 61-0, 61-1, . . . , 61-15 in accordance with an output signal of the line controller 4 and transmits data of the selected line buffer via the sense amplifiers section 54 to one segment of the memory cell array 51 indicated by the segment decoder 53.

On the other hand, the foreground operation is constructed by a line buffer read operation and a line buffer write operation, in the same way as in the prior art.

In a line buffer read operation or a line buffer write operation, note that a plurality of word data can be read or written in one command and one address. The number of word data can be designated by writing burst length data in the control register 31 using an address signal ADD supplied to the address input terminals $INA_0$ to $INA_R$ and the command signal CMD supplied to the command input terminals $INB_0$ to $INB_N$.

Figure 7:
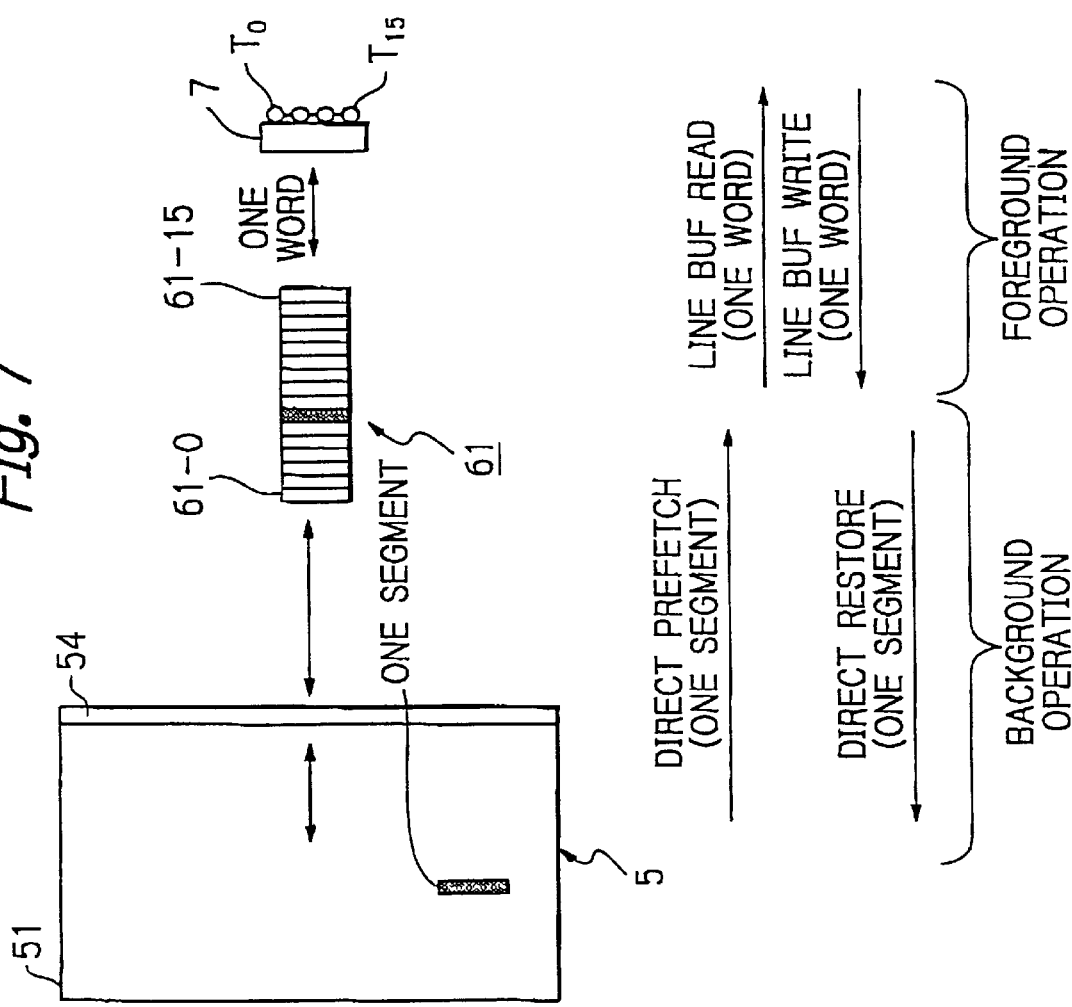
FIG. 7 is a diagram for explaining the operation of the device of FIG. 5.

A first example of direct prefetch operation of the device of FIG. 7 is explained next in detail with reference to FIG. 8A. Note that the direct prefetch operation is carried out when the direct prefetch operation control section 32 receives a direct prefetch command from the command decoder 2 to operate the memory section 5 and the line buffer section 6.

First, one segment of the memory cells MC is selected and activated from the memory cell array 51 by the row decoder 52 and the segment decoder 53 (see ①).

Next, the sense amplifiers of the sense amplifier section 54 corresponding to the selected are activated by the sense enable signals $\phi_{S1}$ and $\overline{\phi}_{Si}$ which are in this case generated by using the output signal of the segment decoder 53 (see ②). In this case, the sense enable signals $\phi_{S1}$ $\overline{\phi}_{S1}$ are defined for the output signal of the segment decoder 53.

Next, the data switch circuits 55 corresponding to the selected segment are operated by the column selection signals Y which are also generated by using the output signal of the segment decoder 53 (see ③). As a result, the data of the selected segment is written into one of the line buffers 61-0, 61-1, . . . , 61-15 selected by the line controller 4 which receives the address signal ADD.

Next, the selected segment is deactivated by the row decoder 52 and the segment decoder 53 (see ④).

Finally, the bit lines are precharged by the precharge circuit 56 and equalized by the equalizer 67 (see ⑤).

A second example of direct prefetch operation of the device of FIG. 7 is explained next in detail with reference to FIG. 8B. Even in this case, the direct prefetch operation is carried out when the direct prefetch operation control section 32 receives a direct prefetch command from the command decoder 2 to operate the memory section 5 and the line buffer section 6.

First, one segment of the memory cells MC is selected and activated from the memory cell array 51 by the row decoder 52 and the segment decoder 53 (see ①).

Next, all the sense amplifiers of the sense amplifier section 54 are activated by the sense enable signals $\phi_S$ and $\overline{\Phi}_S$ (see ②').

Next, the data switch circuits 55 corresponding to the selected segment are operated by the column selection signals Y which are also generated by using the output signal of the segment decoder 53 (see ③). As a result, only the data of the selected segment is written into one of the line buffers 61-0, 61-1, . . . . , 61-15 selected by the line controller 4 which receives the address signal ADD.

Next, the selected segment is deactivated by the row decoder 52 and the segment decoder 53 (see ④).

Finally, the bit lines are precharged by the precharge circuit 56 and equalized by the equalizer 57 (see ⑤).

A first example of direct restore operation of the device of FIG. 7 is explained next in detail with reference to FIG. 9A. Note that the direct restore operation is carried out when the direct restore operation control section 33 receives a direct restore command from the command decoder 2 to operate the memory section 5 and the line buffer section 6.

First, the data switch circuits 55 corresponding to one segment to be selected are operated by the column selection signals Y which are generated by using an output signal of the segment decoder 53 (see ①). As a result, data of one of the line buffers 61-0, 61-1, . . . , 61-15 selected by the line controller 4 which receives the address signal ADD is written into the bit lines BL and $\overline{BL}$ of the segment to be selected.

Next, the sensor amplifiers of the sense amplifier section 54 corresponding to the segment to be selected are activated by the sense enable signals $\phi_{Si}$ and $\overline{\phi}_{S1}$ which are in this case generated by using the output signal of the segment decoder 53 (see ②). In this case, the sense enable signals $\phi_{Si}$ and $\overline{\phi}_{S1}$ are defined for the output signal of the segment decoder 53.

Next, one segment of the memory cells MC is selected and activated from the memory cell array 51 by the row decoder 52 and the segment decoder 53 (see ③).

Next, the selected segment is deactivated by the row decoder 52 and the segment decoder 53 (see ④).

Finally, the bit lines are precharged by the precharge circuit 56 and equalized by the equalizer 57 (see ⑤).

A second example of direct restore operation of the device of FIG. 7 is explained next in detail with reference to FIG. 9B. Even in this case the direct restore operation is carried out when the direct restore operation control section 33 receives a direct restore command from the command decoder 2 to operate the memory section 5 and the line buffer section 6.

First, the data switch circuits 55 corresponding to one segment to be selected are operated by the column selection signals Y which are generated by using an output signal of the segment decoder 53(see ①). As a result, data of one of the line buffers 61-0, 61-1, . . . , 61-15 selected by the line controller 4 which receives the address signal ADD is written into the bit lines BL and $\overline{BL}$ of the segment to be selected.

Next, all the sense amplifiers of the sense amplifier section 54 are activated by the sense enable signals $\phi_S$ and $\overline{\Phi}_S$ (see ②).

Next, one segment of the memory cells MC is selected and activated from the memory cell array 51 by the row decoder 52 and the segment decoder 53 (see ③).

Next, the selected segment is deactivated by the row decoder 52 and the segment decoder 53 (see ④).

Finally, the bit lines are precharged by the precharge circuit 56 and equalized by the equalizer 57 (see ⑤).

Figure 8A:
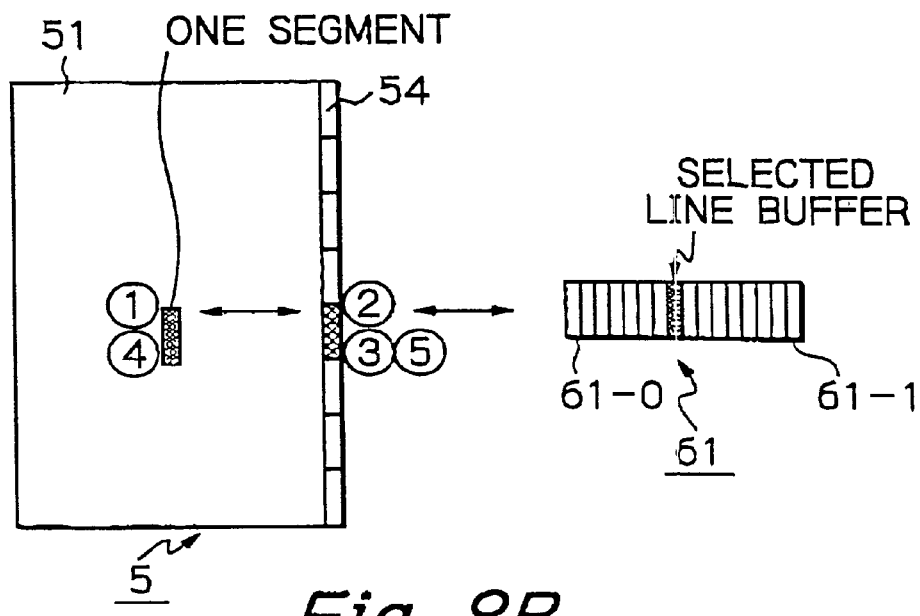
FIGS. 8A and 8B are diagrams for explaining the direct prefetch operation of the device of FIG. 5.
Figure 9A:
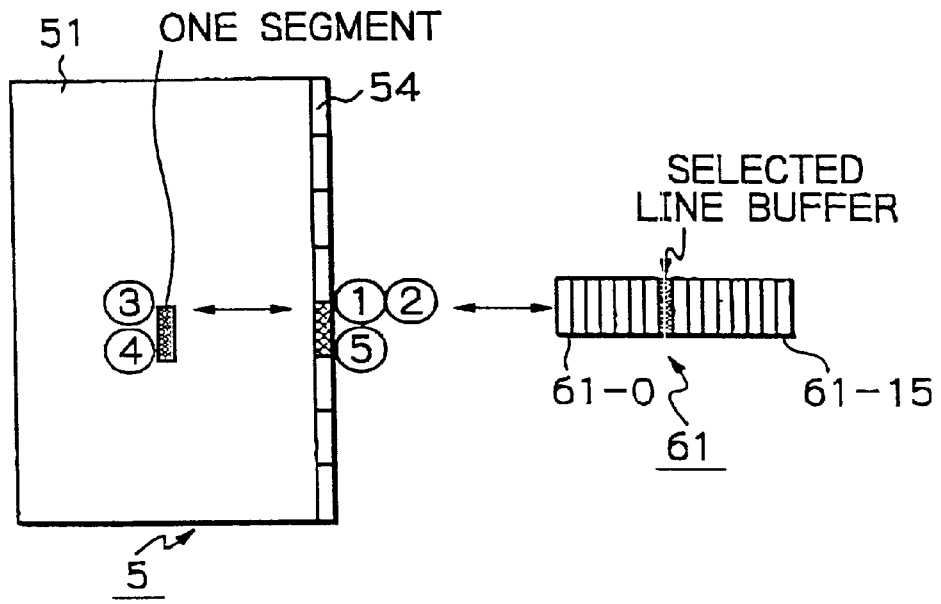
FIGS. 9A and 9B are diagrams for explaining the direct restore operation of the device of FIG. 5.

In the operations as the background operation as illustrated in FIGS. 8A and 9A, since only the memory cells MC of one segment are activated, the power consumption can be reduced. Also, since only the sense amplifiers corresponding to one selected segment are activated, the power consumption can be reduced.

Figure 8B:
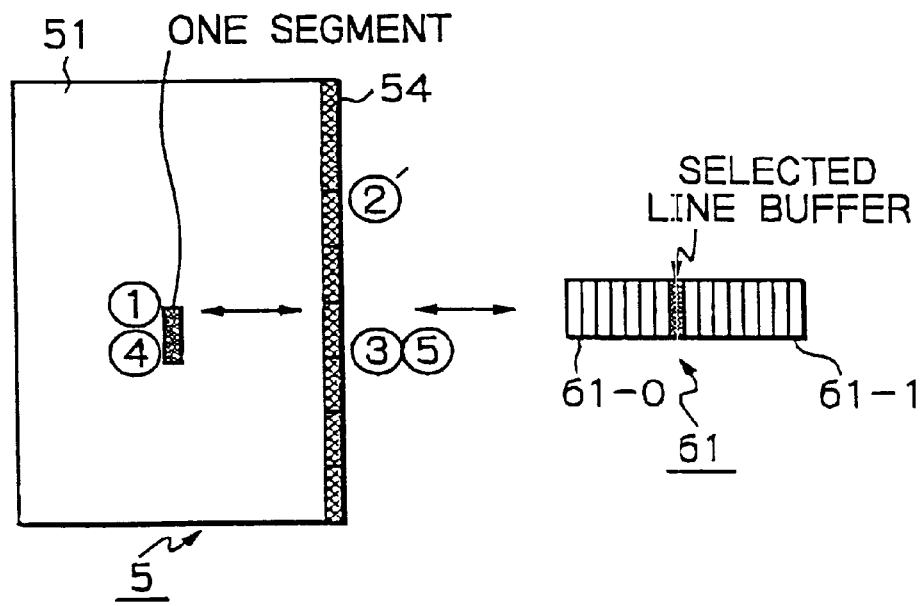
Figure 9B:
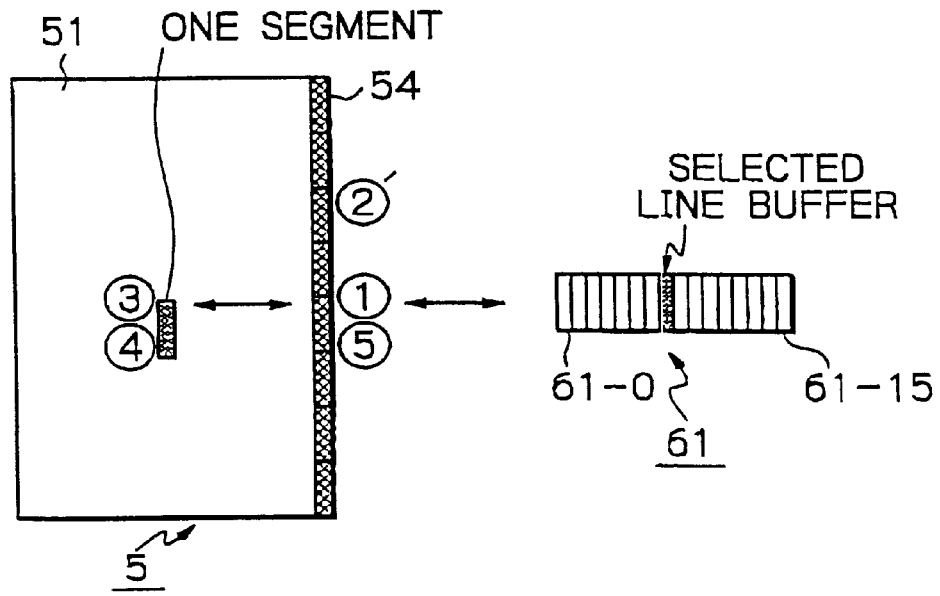

In the operations as the background operation as illustrated in FIGS. 8B and 9B, since only the memory cells MC of one segment are activated, the power consumption can be reduced.

Figure 10A:
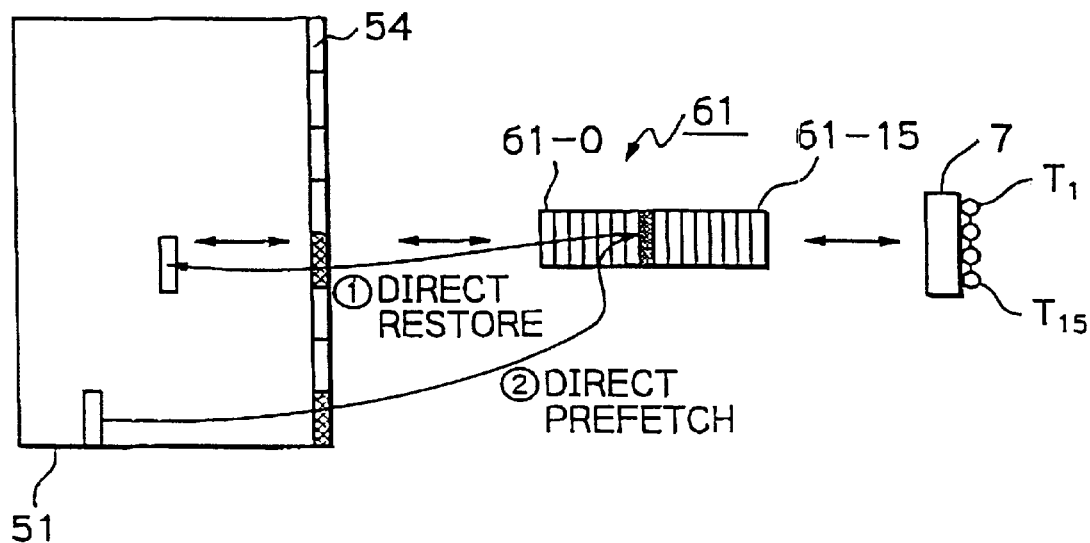
FIGS. 10A and 10B are diagrams for explaining the effects of the present invention and the prior art, respectively.
Figure 10B:
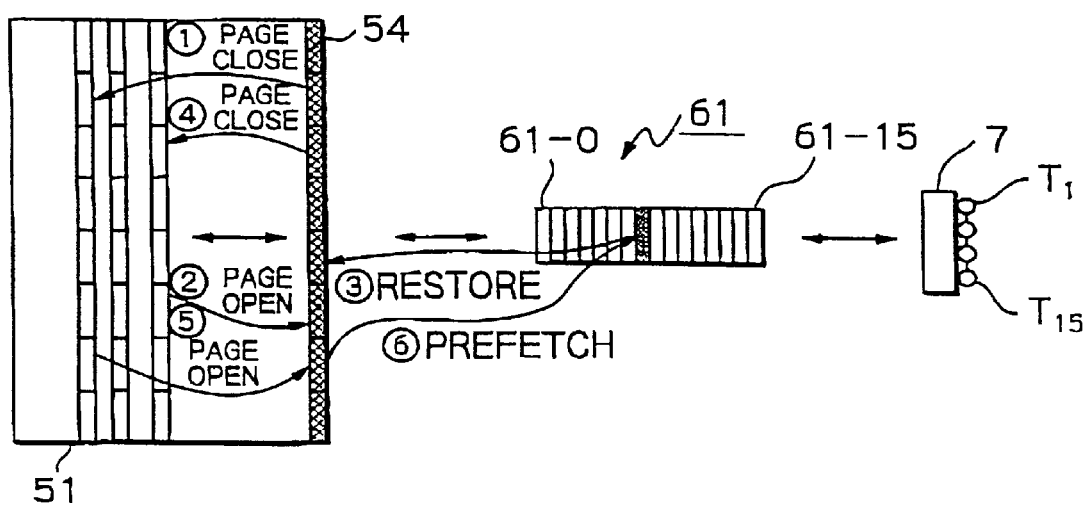

The effect of the present invention is explained with reference to FIG. 10A. That is, when all the line buffers 61-1 to 61-15 are used so that there is no empty line buffer for the next prefetch operation, a direct restore operation as indicated by ① for a predetermined line buffer is carried out, and thereafter, a direct prefetch operation as indicated by ② for the predetermined line buffer is carried out for the next prefetch operation, which simplify the operation. On the other hand, in the prior art, as illustrated in FIG. 10B, when all the line buffers 61-1 to 61-15 are used so that there is no empty line buffer for the next prefetch operation, a page close operation as indicated by ① for the next prefetch operation, a page open operation indicated by ② for a predetermined line buffer a restore operation indicated by ③ for the predetermined line buffer, and a page close operation indicated by ④ for the restore operation are carried out, and thereafter, a page open operation indicated by ⑤ and a prefetch operation as indicated by ⑥ are carried out for the next prefetch operation, which complicate the operation.

In the above-described embodiment, although the line controller 4 is provided, the function of the line controller 4 can be introduced into the command controller 3'.

Also, in FIG. 8B and 9B, although all the sense amplifiers corresponding to one page are operated for a direct prefetch operation a direct restore operation, only the sense amplifiers corresponding to two or more segments can be operated.

Further, the line buffer section 6 can be of a full associative type or of a set associative type. In the full associative type, data of any segment of the memory cell array 51 can be written into an arbitrary one of the line buffers 61-0, 61-1, . . . , 61-15 or vice versa. In the set associative type, data of a segment of the memory cell array 51 can be written into one of a predetermined range of the line buffers 61-0, 61-1, . . . , 61-15 depending upon the location of the segment or vice versa.

As explained hereinabove, according to the present invention, since there are only two kinds of memory access modes, i.e., a line buffer hit mode a line buffer mishit mode which have different access times, the management for scheduling the memory access can be simplified.

Also, even in a line buffer mishit mode only one direct prefetch operation is carried out to access the line buffer section, the delay of the memory access can be reduced. Additionally, in a line buffer mishit mode, only the line buffer management of which segments are located in the line buffers 61-0, 61-1, . . . , 61-15 is required, which simplifies the management of the device.

Particularly, in a prefetch operation where no line buffers are hit, when one segment is required to be restored, only a simple short, i.e., a direct restore operation is required before the prefetch operation.

Further, when random memory accesses inviting line buffer mishit modes are carried out so that background operations are often carried out, the delay of the memory access is not increased due to the fact that each background operation is simple.

What is claimed is:

1. A line buffer type semiconductor memory device comprising:
   a memory section;
   a line buffer section including a plurality of line buffers each capable of storing data of one segment size;
   a direct fetch control section, connected to said memory section and said line buffer section, for reading first data of one segment size from said memory section and writing said first data into one of said line buffers; and
   a direct restore control section, connected to said memory section and said line buffer section, for reading second data of one segment size from one of said line buffers and writing said second data into said memory section.

2. The device as set forth in claim 1, further comprising:
   a data buffer capable of storing data of one word size;
   a line buffer read control section, connected to said line buffer section, for reading third data of one word size from one of said line buffers and writing said third data into said data buffer; and
   a line buffer write control section, connected to said line buffer section, for reading fourth data of one word size from said data buffer into one of said line buffers.

3. The device as set forth in claim 2, further comprising a control register, connected to said line buffer section, for sequentially accessing a series of word data from said line buffers.

4. The device as set forth in claim 1, further comprising a line controller, connected to said line buffer section, for designating one of said line buffers.

5. The device as set forth in claim 1, wherein said memory section comprises:
   a memory cell array; and
   a sense amplifier section including sense amplifiers connected to said memory cell array;

said direct prefetch control section and said direct restore control section operating the sense amplifiers of said sense amplifier section corresponding to one segment.

6. The device as set forth in claim 1, wherein said memory section comprises:

a memory cell array; and a sense amplifier section including sense amplifiers connected to said memory cell array;

said direct prefetch control section and said direct restore control section operating the sense amplifiers of said sense amplifier section corresponding to a plurality of segments.

7. The device as set forth in claim 1, wherein said memory section comprises:

a plurality of bit lines;

a memory cell array connected to said bit lines; and a sense amplifier section including sense amplifiers connected to said bit lines;

said direct prefetch control section and said direct restore control section precharging and equalizing said bit lines after operating the sense amplifiers of said sense amplifier section corresponding to at least one segment.

* * * * *